United States Patent
Peng

(10) Patent No.: US 8,716,722 B2
(45) Date of Patent: May 6, 2014

(54) PHOTOSENSOR CHIP PACKAGE STRUCTURE

(75) Inventor: Yin-Ming Peng, Tao Yuan County (TW)

(73) Assignee: TXC Corporation, Ping Cheng, Tao Yuan County (TW)

(*) Notice: Subject to any disclaimer, the term of this patent is extended or adjusted under 35 U.S.C. 154(b) by 49 days.

(21) Appl. No.: 13/544,806

(22) Filed: Jul. 9, 2012

(65) Prior Publication Data

US 2013/0341650 A1 Dec. 26, 2013

(30) Foreign Application Priority Data

Jun. 22, 2012 (TW) .............................. 101122388 A

(51) Int. Cl.
| | |
|---|---|
| H01L 29/16 | (2006.01) |
| H01L 33/00 | (2010.01) |
| H01L 23/31 | (2006.01) |
| H01L 25/16 | (2006.01) |

(52) U.S. Cl.
CPC ................ H01L 23/31 (2013.01); H01L 25/16 (2013.01)
USPC ............... 257/82; 257/79; 257/186; 257/233; 257/234; 257/292; 257/462; 257/E33.072; 257/E33.076; 257/E33.077; 257/E31.115

(58) Field of Classification Search
CPC ....................................................... H01L 23/31
USPC ............. 257/82, 79, 186, 233, 234, 292, 462, 257/E33.076, E33.077, E31.115, E33.072
See application file for complete search history.

(56) References Cited

U.S. PATENT DOCUMENTS

| | | | |
|---|---|---|---|
| 2004/0090304 A1* | 5/2004 | Hetherton et al. | 338/22 R |
| 2010/0155766 A1* | 6/2010 | Ku | 257/99 |
| 2010/0225380 A1* | 9/2010 | Hsu et al. | 327/514 |
| 2013/0105822 A1* | 5/2013 | Wang et al. | 257/82 |

* cited by examiner

Primary Examiner — Long K Tran
(74) Attorney, Agent, or Firm — Muncy, Geissler, Olds & Lowe, P.C.

(57) ABSTRACT

A photosensor chip package structure comprises a substrate, a light-emitting chip and a photosensor chip including an ambient light sensing unit and a proximity sensing unit. The substrate has a first basin, a second basin and a light-guiding channel. The openings of the first and second basins respectively face different directions. One opening of the light-guiding channel and the opening of the first basin face the same direction. The other opening of the light-guiding channel interconnects with the second basin. The light-emitting chip is arranged in the first basin. The photosensor chip is arranged in the second basin. The light-guiding channel conducts the light generated by the light-emitting chip and the ambient light to the photosensor chip. The photosensor chip operates as soon as it receives the light generated by the light-emitting chip and/or the ambient light.

11 Claims, 7 Drawing Sheets

PHOTOSENSOR CHIP PACKAGE STRUCTURE

BACKGROUND OF THE INVENTION

1. Field of the Invention

The present invention relates to a photosensor chip package structure, particularly to a package structure of a photosensor chip containing an ambient light sensing unit and a proximity sensing unit.

2. Description of the Related Art

More and more sensors are used by consumer electronics, such as mobile phones, to save energy and improve human-machine interaction. For example, the latest mobile phones use as many as more than ten sensors. Therefore, engineers are eager to integrate sensors so as to save energy, space and cost.

The ambient light sensor is used to detect variation of ambient light so as to regulate brightness of the screen of a mobile phone. When the ambient light dims, the screen of a mobile phone also dims lest the light of the screen dazzle the user. When the ambient light brightens, the backlight of the screen also brightens to enhance visibility of the articles presented on the screen. Therefore, the ambient light sensor can save energy and increase the running time of a mobile phone. The proximity sensor is a non-contact object-detection sensor. In mobile phones, the proximity sensor is used to disable the touch control function when the user is talking with a contact. As soon as the user's head approaches the earpiece, the touch control function is automatically turned off lest the touchscreen operate erroneously by touching the user's face. As both the ambient light sensor and the proximity sensor are optical systems, they are normally encapsulated in an identical package structure so as to share the space, materials, wiring and power source.

Refer to FIG. 1 for a conventional photosensor chip package structure, wherein an IR LED (Light Emitting Diode) 14 and a sensor 13 containing an ambient light sensing unit 10 and a proximity sensing unit 12 are encapsulated inside a package 16 to form the so-called three-in-one package structure, whereby is decreased the space occupied by the package 16 and reduced the complexity of system design. The IR LED 14 emits infrared light. The infrared light is reflected by an object approaching the mobile phone and received by the proximity sensing unit 12. The proximity sensing unit 12 operates as soon as receiving the reflected infrared light. However, infrared light is also projected from the lateral sides of the IR LED 14, interfering with the normal light signal. Therefore, various thick light-blocking materials and package designs are used to form a light blocking wall 18 preventing from the interference between the sensor 13 and the IR LED 14. Further, the spacing between the sensor 13 and the IR LED 14 is also increased to achieve the same objective. However, the thick light-blocking material and the increased spacing make the area of the package structure hard to reduce. Besides, the light-blocking material increases complexity of the package structure.

Accordingly, the present invention proposes a novel photosensor chip package structure to solve the abovementioned problems.

SUMMARY OF THE INVENTION

The primary objective of the present invention is to provide a photosensor chip package structure, which adopts a stacking design, whereby is decreased the area of the package structure.

Another objective of the present invention is to provide a photosensor chip package structure, which is free of the conventional light-blocking wall, whereby are simplified the package structure and fabrication process.

A further objective of the present invention is to provide a photosensor chip package structure, which can reduce the interference of light signals.

To achieve the abovementioned objectives, the present invention proposes a photosensor chip package structure, which comprises a substrate, a light-emitting chip and a photosensor chip.

The substrate has a first basin, a second basin and a light-guiding channel. The substrate is opaque. The openings of the first and second basins respectively face different directions. One opening of the light-guiding channel and the opening of the first basin face the same direction. The other opening of the light-guiding channel interconnects with the second basin. The light-emitting chip is arranged in the first basin. The photosensor chip is arranged in the second basin. The photosensor chip includes an ambient light sensing unit and a proximity sensing unit. The light-guiding channel conducts the light generated by the light-emitting chip and the ambient light to the photosensor chip. The photosensor chip operates as soon as it receives the light generated by the light-emitting chip and/or the ambient light.

Below, embodiments are described in detail in cooperation with drawings to make easily understood the technical contents and accomplishments of the present invention.

DETAILED DESCRIPTION OF THE INVENTION

Figure 1:
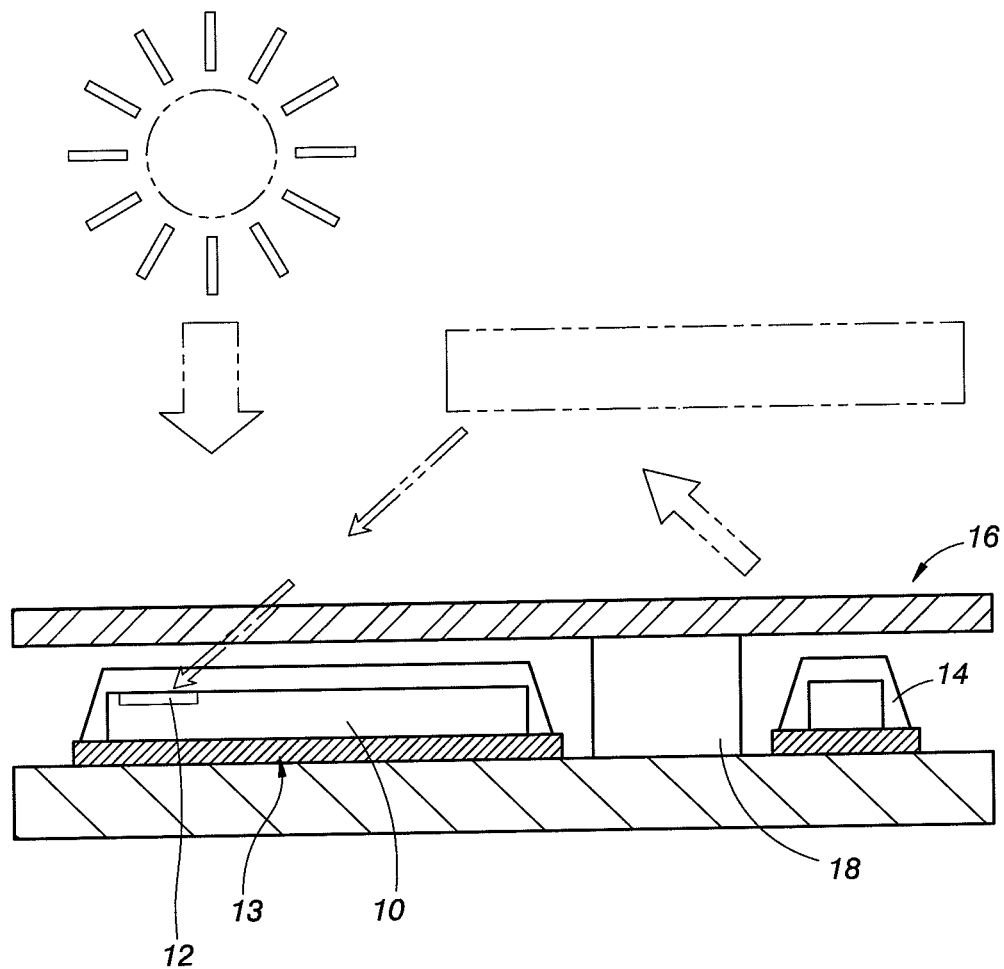
FIG. 1 schematically shows a conventional photosensor chip package structure.
Figure 2A:
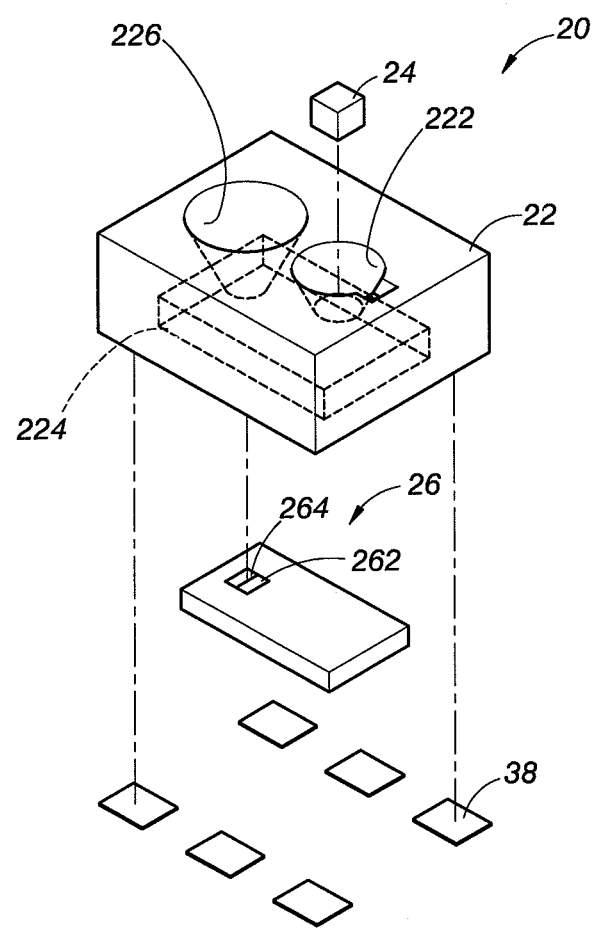
FIGS. 2(a)-2(d) are respectively a perspective view, a sectional view, a top view and a bottom view schematically showing a photosensor chip package structure according to a first embodiment of the present invention.
Figure 2B:
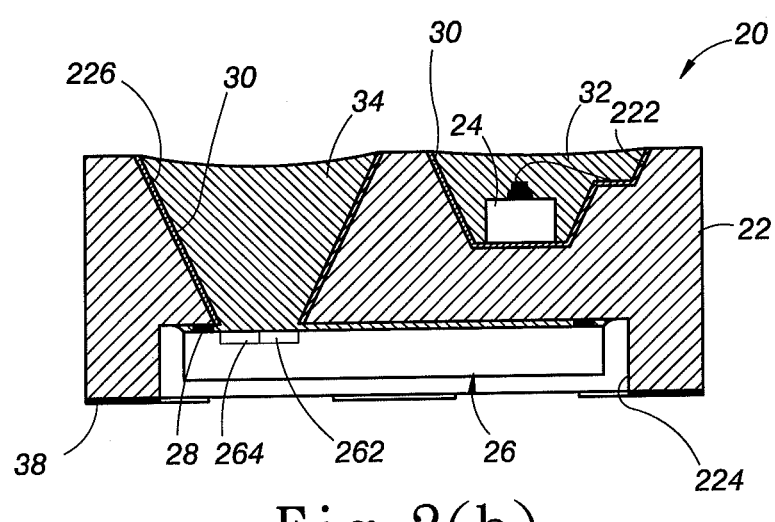
Figure 2C:
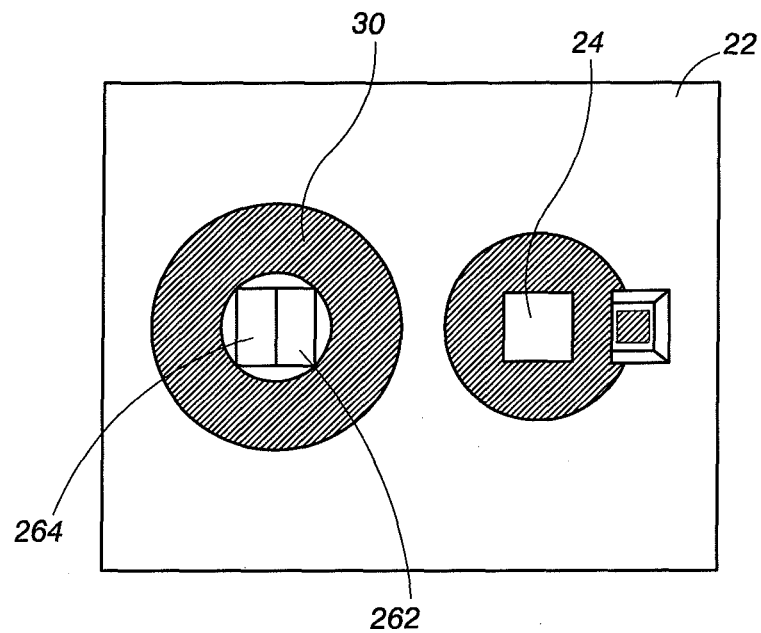
Figure 2D:
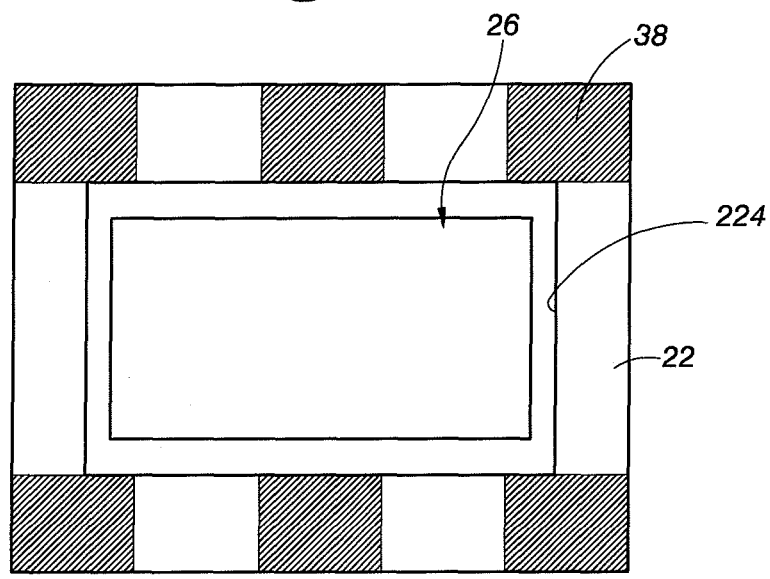

Refer to FIGS. 2(a)-2(d), which are respectively a perspective view, a sectional view, a top view and a bottom view of a photosensor chip package structure according to a first embodiment of the present invention. The photosensor chip package structure 20 of the present invention comprises a substrate 22, a light-emitting chip 24 and a photosensor chip 26.

The substrate 22 has a first basin 222, a second basin 224 and a light-guiding channel 226. The substrate 22 is opaque. The openings of the first basin 222 and the second basin 224 respectively face different directions, especially in opposite directions. The first basin 222 and the second basin 224 at least partly overlap without interconnection. One opening of the light-guiding channel 226 and the opening of the first basin 222 face the same direction. The other opening of the light-guiding channel 226 interconnects with the second basin 224.

The light-emitting chip 24 is arranged in the first basin 222. In one embodiment, the light-emitting chip 24 is an infrared LED. The photosensor chip 26 is arranged in the second basin 224. In one embodiment, the photosensor chip 26 is installed in the second basin 224 from the opening of the second basin 224 and connected with the substrate 22 via metallic bumps in a flip-chip technology. The metallic bumps may be replaced by solder balls.

The photosensor chip 26 includes an ambient light sensing unit 262 and a proximity sensing unit 264, which are within the coverage of the opening of the light-guiding channel 226. The light-guiding channel 226 conducts the light generated by the light-emitting chip 24 and the ambient light to the photosensor chip 26. The opening of the light-guiding channel 226 is smaller than the opening of the second basin 224. The photosensor chip 26 operates as soon as it receives the light generated by the light-emitting chip 24 and/or the ambient light. Via the abovementioned structure is decreased the interference by the light projected from the lateral sides of the light-emitting chip 24.

In one embodiment, the first basin 222 is formed in the top of the substrate 22, and the second basin 224 is formed in the bottom of the substrate 22; the first basin 222 overlaps the second basin 224 to reduce the area of the package structure. In such a case, the substrate 22 has an H-like structure.

The substrate 22 is a single-layer ceramic substrate containing on-chip interconnects thereinside, a printed circuit board, or another material. In one embodiment, the substrate 22 is a surface mounted device (SMD) containing solder pads 38 on the bottom thereof. The first basin 222 is in form of a cup or another shape to decrease the beam angle of the light-emitting chip 24 or improve the performance of the light-emitting chip 24. The bottom or surface of the first basin 222 has a reflective layer 30 to increase the projection range of the light-emitting chip 24 or to form a light-blocking layer for reducing the interference of light signals.

The light-guiding channel 226 has a larger opening on the side of the first basin 222 and a smaller opening on the side of the second basin 224. The design favors collecting the ambient light or the light generated by the light-emitting chip 24 and also favors conducting the light to the photosensor chip 26. For example, the light-guiding channel 226 adopts a cup-like structure, as shown in the drawings.

The photosensor chip package structure 20 of the present invention further comprises a first encapsulant 32 filled into the first basin 222 to cover the light-emitting chip 24 and a second encapsulant 34 filled into the light-guiding channel 226 and cover the surface of the photosensor chip 26. In one embodiment, the first encapsulant 32 and the second encapsulant 34 are made of an identical light-permeable material. In one embodiment, the first encapsulant 32 and the second encapsulant 34 are made of a transparent material so as to achieve the optimized light conductivity.

Figure 5:
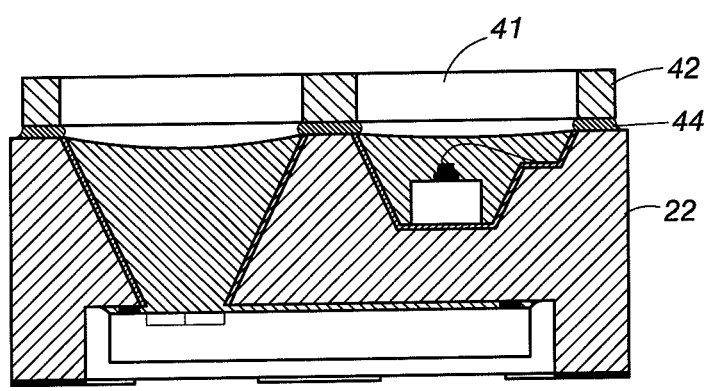
FIG. 5 is a sectional view schematically showing a photosensor chip package structure according to a third embodiment of the present invention.

In one embodiment shown in FIG. 5, a top cover 42 having an opening 41 is mounted on the top of the substrate 22 and joined to the substrate 22 with an encapsulating resin or a solder paste 44 so as to improve the anti-interference ability.

Figure 3:
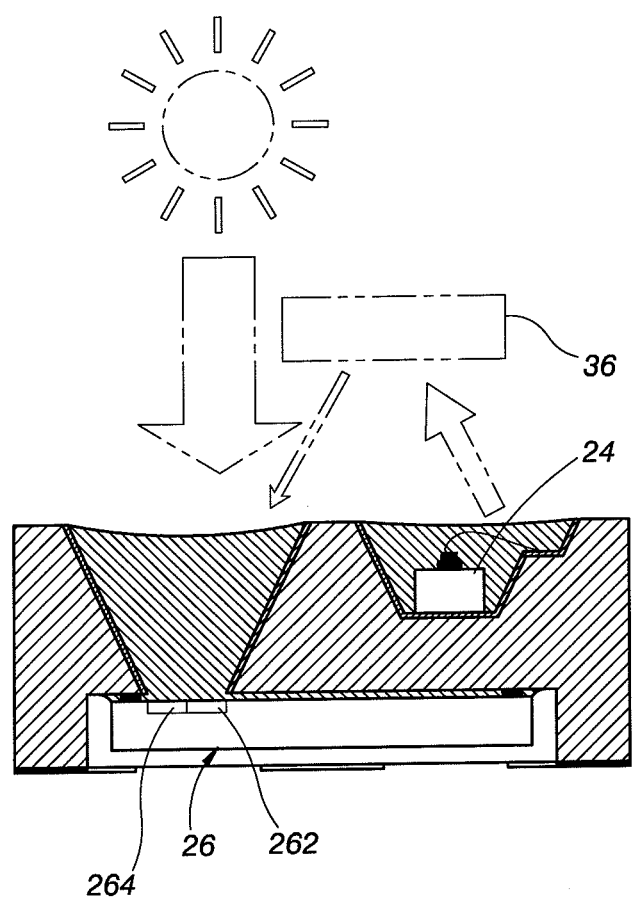
FIG. 3 schematically shows the operation of a photosensor chip package structure according to one embodiment of the present invention.

Refer to FIG. 3 a diagram schematically showing the operation of a photosensor chip package structure according to one embodiment of the present invention. The light-guiding channel 226 conducts the ambient light to ambient light sensing unit 262 of the photosensor chip 26. When an object 36 approaches the package structure, the object 36 reflects the light generated by the light-emitting chip 24 to the light-guiding channel 226. Then, the light-guiding channel 226 conducts the reflected light to the proximity sensing unit 264 of the photosensor chip 26. Thus, the proximity sensing unit 264 detects that an object is approaching.

Figure 4:
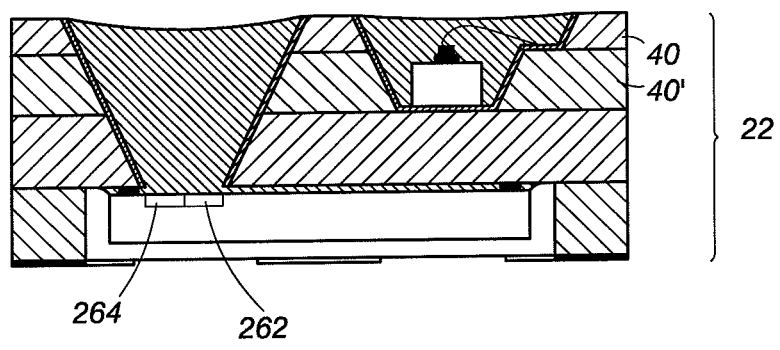
FIG. 4 is a sectional view schematically showing a photosensor chip package structure according to a second embodiment of the present invention.

Refer to FIG. 4 a sectional view schematically showing a photosensor chip package structure according to a second embodiment of the present invention. The second embodiment is different from the first embodiment in that the substrate 22 is formed via stacking several ceramic substrates 40 and 40' containing on-chip interconnects, several PCB's or other materials.

The photosensor chip package structure of the present invention has the following advantages:
1. The present invention adopts a stacking design and thus can decrease the area of the package structure;
2. The present invention is free of the conventional light-blocking walls and thus simplifies the package structure and fabrication process for preventing from interference of light signals;
3. The present invention can decrease the interference of light signals.

The embodiments described above are only to exemplify the present invention but not to limit the scope of the present invention. Any equivalent modification or variation according to the characteristic or spirit of the present invention is to be also included within the scope of the present invention.

What is claimed is:

1. A photosensor chip package structure comprising
  a substrate including a first basin, a second basin and a light-guiding channel, wherein said substrate is opaque, and wherein an opening of said first basin and an opening of said second basin respectively face opposite directions, and wherein an opening of said light-guiding channel and said opening of said first basin face an identical direction, and wherein another opening of said light-guiding channel interconnects with said second basin;
  a light-emitting chip arranged inside said first basin; and
  a photosensor chip arranged inside said second basin from said opening of said second basin and including an ambient light sensing unit and a proximity sensing unit, wherein said light-guiding channel conducts ambient light and light generated by said light-emitting chip to said photosensor chip, and wherein said photosensor chip operates after receiving ambient light or light generated by said light-emitting chip.

2. The photosensor chip package structure according to claim 1, wherein said first basin is formed in a top of said substrate, and said second basin is formed in a bottom of said substrate, and wherein at least a portion of said first basin overlaps said second basin without interconnection.

3. The photosensor chip package structure according to claim 1, wherein said first basin has a reflective layer on a bottom or a surface thereof.

4. The photosensor chip package structure according to claim 1, wherein said light-emitting chip is an infrared light-emitting diode.

5. The photosensor chip package structure according to claim 1, wherein said photosensor chip is packaged inside said second basin in a flip-chip way.

6. The photosensor chip package structure according to claim 1 further comprising a first encapsulant and a second encapsulant, wherein said first encapsulant is filled into said first basin and covers said light-emitting chip, and wherein said second encapsulant is filled into said light-guiding channel and covers said photosensor chip, and wherein said first encapsulant and said second encapsulant are made of a light-permeable material.

7. The photosensor chip package structure according to claim 1, wherein said light-guiding channel has a larger opening on a side of said first basin and a smaller opening on a side of said second basin.

8. The photosensor chip package structure according to claim 1, wherein said substrate is a ceramic substrate containing on-chip interconnects thereinside or a printed circuit board, and wherein said substrate has solder pads on a bottom thereof to form a surface mounted device.

9. The photosensor chip package structure according to claim 8, wherein said substrate is formed via stacking a plurality of ceramic substrates containing on-chip interconnects thereinside or a plurality of printed circuit boards.

10. The photosensor chip package structure according to claim 1, wherein a top cover having an opening is mounted on a top of said substrate to improve anti-interference performance.

11. The photosensor chip package structure according to claim 1, wherein said opening of said light-guiding channel is smaller than said opening of said second basin.

* * * * *